United States Patent
Higo et al.

(10) Patent No.: US 8,445,980 B2
(45) Date of Patent: May 21, 2013

(54) MEMORY ELEMENT AND MEMORY DEVICE

(75) Inventors: Yutaka Higo, Kanagawa (JP); Masanori Hosomi, Tokyo (JP); Hiroyuki Ohmori, Kanagawa (JP); Kazuhiro Bessho, Kanagawa (JP); Kazutaka Yamane, Kanagawa (JP); Hiroyuki Uchida, Tokyo (JP)

(73) Assignee: Sony Corporation, Tokyo (JP)

( * ) Notice: Subject to any disclaimer, the term of this patent is extended or adjusted under 35 U.S.C. 154(b) by 26 days.

(21) Appl. No.: 13/216,453

(22) Filed: Aug. 24, 2011

(65) Prior Publication Data

US 2012/0056284 A1    Mar. 8, 2012

(30) Foreign Application Priority Data

Sep. 8, 2010    (JP) .................................. 2010-200984

(51) Int. Cl.
*H01L 29/82*    (2006.01)
*H01L 43/00*    (2006.01)

(52) U.S. Cl.
USPC .................................. 257/421; 257/E29.323

(58) Field of Classification Search
USPC .......................................... 257/421, E29.323
See application file for complete search history.

(56) References Cited

U.S. PATENT DOCUMENTS

| 6,256,223 B1 | 7/2001 | Sun |
| 7,242,045 B2 | 7/2007 | Nguyen et al. |
| 7,660,153 B2 | 2/2010 | Yamane et al. |
| 2012/0056283 A1* | 3/2012 | Yamane et al. ............... 257/421 |
| 2012/0056288 A1* | 3/2012 | Yoshihara et al. ............ 257/431 |
| 2012/0057403 A1* | 3/2012 | Bessho et al. ................. 365/171 |
| 2012/0063220 A1* | 3/2012 | Higo et al. .................... 365/173 |

FOREIGN PATENT DOCUMENTS

| JP | 2003-17782 | 1/2003 |
| JP | 2008-227388 | 9/2008 |

OTHER PUBLICATIONS

L Berger, "Emission of spin waves by a magnetic multilayer traversed by a current", Physical Review B, vol. 54, No. 13, 1996.
J.C. Slonczewski, "Current-driven excitation of magnetic multilayers", Journal of Magnetism and Magnetic Material, 159, L1-L7, 1996.
Albert, et al., "Spin-polarized current switching of a Co thin film nanomagnet", Applied Physics Letters, vol. 77, No. 23, 2000.

* cited by examiner

*Primary Examiner* — David S Blum
(74) *Attorney, Agent, or Firm* — K&L Gates LLP

(57) ABSTRACT

There is disclosed a memory element which includes a layered structure. The layered structure includes a memory layer that has a magnetization perpendicular to a film face; a magnetization-fixed layer having magnetization perpendicular to the film face; an insulating layer provided between the memory layer and the magnetization-fixed layer; and a cap layer provided at a face side, which is opposite to the insulating layer-side face, of the memory layer, in which an electron that is spin-polarized is injected in a lamination direction of the layered structure, and thereby the magnetization direction of the memory layer varies and a recording of information is performed, a magnitude of an effective diamagnetic field which the memory layer receives is smaller than a saturated magnetization amount of the memory layer, and at least a face, which comes into contact with the memory layer, of the cap layer is formed of a Ta film.

6 Claims, 12 Drawing Sheets

FIG. 7A
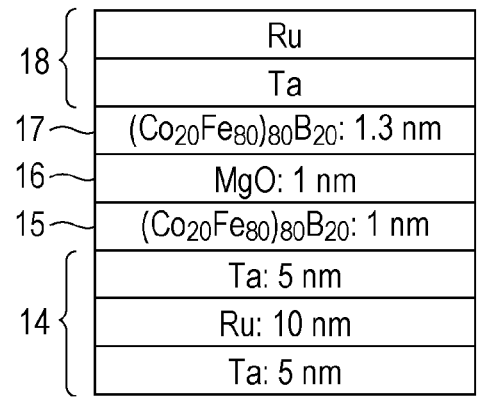
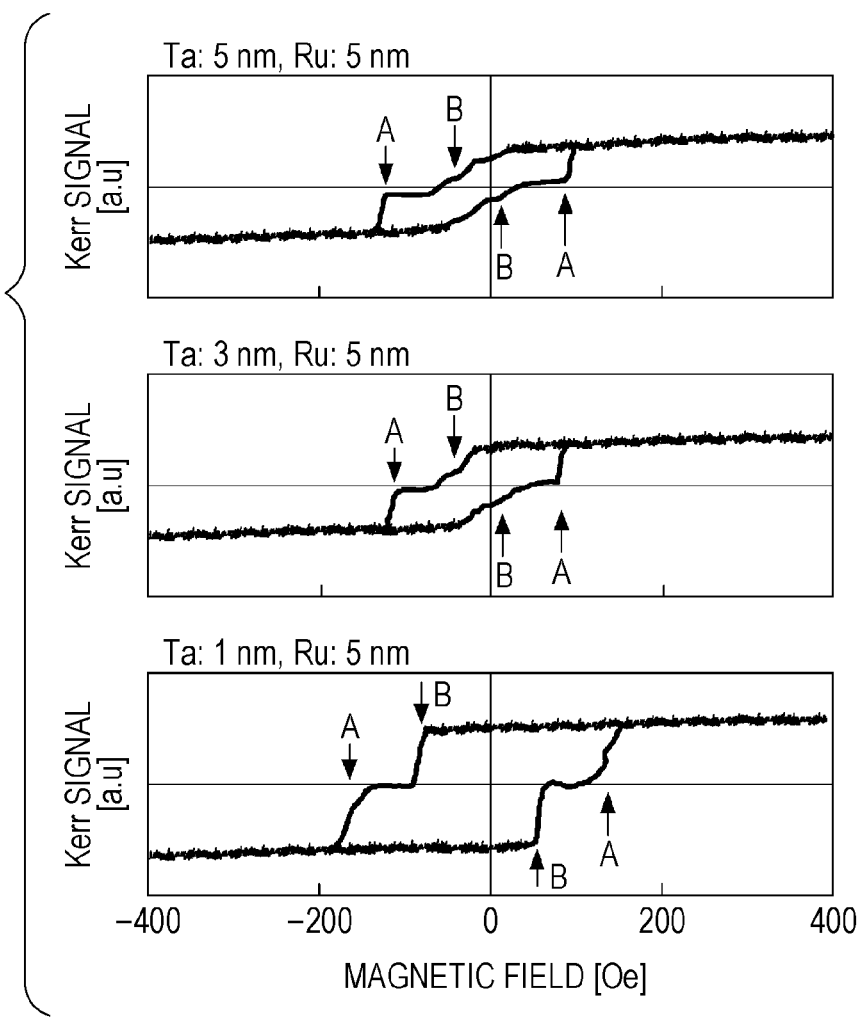
FIG. 7B

MEMORY ELEMENT AND MEMORY DEVICE

CROSS REFERENCES TO RELATED APPLICATIONS

The present application claims priority to Japanese Priority Patent Application JP 2010-200984 filed in the Japan Patent Office on Sep. 8, 2010, the entire contents of which are hereby incorporated by reference.

BACKGROUND

The present application relates to a memory element that includes a memory layer that stores the magnetization state of a ferromagnetic layer as information and a magnetization-fixed layer in which a magnetization direction is fixed, and that changes the magnetization direction of the memory layer by flowing a current, and a memory device having the memory element.

In an information device such as a computer, a highly dense DRAM that operates at a high speed has been widely used as a random access memory.

However, the DRAM is a volatile memory in which information is erased when power is turned off, such that a non-volatile memory in which the information is not erased is desirable.

In addition, as a candidate for the non-volatile memory, a magnetic random access memory (MRAM) in which the information is recorded by magnetization of a magnetic material has attracted attention and therefore has been developed.

The MRAM makes a current flow to two kinds of address interconnects (a word line and a bit line) that are substantially perpendicular to each other, respectively, and inverts the magnetization of a magnetic layer of a magnetic memory element, which is located at an intersection of the address interconnects, of the memory device by using a current magnetic field generated from each of the address interconnects, and thereby performs the recording of information.

A schematic diagram (perspective view) of a general MRAM is shown in FIG. 10.

A drain region 108, a source region 107, and a gate electrode 101, which make up a selection transistor that selects each memory cell, are formed at portions separated by an element separation layer 102 of a semiconductor substrate 110 such as a silicon substrate, respectively.

In addition, a word line 105 extending in the front-back direction in the drawing are provided at an upper side of the gate electrode 101.

The drain region 108 is formed commonly to left and right selection transistors in the drawing, and an interconnect 109 is connected to the drain region 108.

In addition, magnetic memory elements 103, each having a memory layer whose magnetization direction is inverted, are disposed between the word line 105 and bit lines 106 that are disposed at an upper side in relation to the word line 105 and extend in the left-right direction. These magnetic memory elements 103 are configured, for example, by a magnetic tunnel junction element (MTJ element).

In addition, the magnetic memory elements 103 are electrically connected to the source region 107 through a horizontal bypass line 111 and a vertical contact layer 104.

When a current is made to flow to the word line 105 and the bit lines 106, a current magnetic field is applied to the magnetic memory element 103 and thereby the magnetization direction of the memory layer of the magnetic memory element 103 is inverted, and therefore it is possible to perform the recording of information.

In addition, in regard to a magnetic memory such as the MRAM, it is necessary for the magnetic layer (memory layer) in which the information is recorded to have a constant coercive force in order to stably retain the recorded information.

On the other hand, it is necessary to make a certain amount of current flow to the address interconnect to order to rewrite the recorded information.

However, along with miniaturization of the element making up the MRAM, the address interconnect becomes thin, such that it is difficult to flow a sufficient current.

Therefore, as a configuration capable of realizing the magnetization inversion with a relatively small current, a memory having a configuration using a magnetization inversion by spin injection has attracted attention (for example, refer to Japanese Unexamined Patent Application Publication Nos. 2003-17782 and 2008-227388, and a specification of U.S. Pat. No. 6,256,223, Phys. Rev. B, 54.9353 (1996), and J. Magn. Mat., 159, L1 (1996)).

Magnetization inversion by the spin injection means that a spin polarized electron after passing through a magnetic material is injected into the other magnetic material, and thereby magnetization inversion is caused in the other magnetic material.

For example, when a current is made to flow to a giant magnetoresistive effect element (GMR element) or a magnetic tunnel junction element (MTJ element) in a direction perpendicular to a film face, the magnetization direction of at least a part of the magnetic layer of this element may be inverted.

In addition, magnetization inversion by spin injection has an advantage in that even when the element becomes minute, it is possible realize the magnetization inversion without increasing the current.

A schematic diagram of the memory device having a configuration using magnetization inversion by the above-described spin injection is shown in FIGS. 11 and 12. FIG. 11 shows a perspective view, and FIG. 12 shows a cross-sectional view.

A drain region 58, a source region 57, and a gate electrode 51 that make up a selection transistor for the selection of each memory cell are formed, respectively, in a semiconductor substrate 60 such as a silicon substrate at portions isolated by an element isolation layer 52. Among them, the gate electrode 51 also functions as a word line extending in the front-back direction in FIG. 11.

The drain region 58 is formed commonly to left and right selection transistors in FIG. 11, and an interconnect 59 is connected to the drain region 58.

A memory element 53 having a memory layer in which a magnetization direction is inverted by spin injection is disposed between the source region 57 and bit lines 56 that are disposed in an upper side of the source region 57 and extended in the left-right direction in FIG. 11.

This memory element 53 is configured by, for example, a magnetic tunnel junction element (MTJ element). The memory element 53 has two magnetic layers 61 and 62. In the two magnetic layers 61 and 62, one side magnetic layer is set as a magnetization-fixed layer in which the magnetization direction is fixed, and the other side magnetic layer is set as a magnetization-free layer in which the magnetization direction varies, that is, a memory layer.

In addition, the memory element 53 is connected to each bit line 56 and the source region 57 through the upper and lower contact layers 54, respectively. In this manner, when a current is made to flow to the memory element 53, the magnetization direction of the memory layer may be inverted by spin injection.

In the case of the memory device having a configuration using magnetic inversion by this spin injection, it is possible to make the structure of the device simple compared to the general MRAM shown in FIG. 10, and therefore it has a characteristic in that high densification becomes possible.

In addition, when magnetization inversion by the spin injection is used, there is an advantage in that even as miniaturization of the element proceeds, the write current is not increased, compared to the general MRAM performing magnetization inversion by an external magnetic field.

SUMMARY

However, in the case of the MRAM, a write interconnect (word line or bit line) is provided separately from the memory element, and the writing of information (recording) is performed using a current magnetic field generated by flowing a current to the write interconnect. Therefore, it is possible to make a sufficient amount of current necessary for the writing flow to the write interconnect.

On the other hand, in the memory device having a configuration using magnetization inversion by spin injection, it is necessary to invert the magnetization direction of the memory layer by performing spin injection using a current flowing to the memory element.

Since the writing (recording) of information is performed by directly flowing a current to the memory element as described above, a memory cell is configured by connecting the memory element to a selection transistor to select a memory cell that performs the writing. In this case, the current flowing to the memory element is restricted to a current magnitude capable of flowing to the selection transistor (a saturation current of the selection transistor).

Therefore, it is necessary to perform writing with a current equal to or less than the saturation current of the selection transistor, and therefore it is necessary to diminish the current flowing to the memory element by improving spin injection efficiency.

In addition, to increase the read-out signal strength, it is necessary to secure a large magnetoresistance change ratio, and to realize this, it is effective to adopt a configuration where an intermediate layer that comes into contact with both sides of the memory layer is set as a tunnel insulating layer (tunnel barrier layer).

In this way, in a case where the tunnel insulating layer is used as the intermediate layer, the amount of current flowing to the memory element is restricted to prevent the insulation breakdown of the tunnel insulating layer. From this viewpoint, it is also necessary to restrict the current at the time of spin injection.

Since such a current value is proportional to a film thickness of the memory layer and is proportional to the square of the saturation magnetization of the memory layer, it may be effective to adjust these (film thickness and saturated magnetization) to decrease such a current value (for example, refer to F. J. Albert et al., Appl. Phy. Lett., 77, 3809 (2000)).

For example, in U.S. Pat. No. 7,242,045, the fact that when the amount of magnetization (Ms) of the recording material is decreased, the current value may be diminished is disclosed.

However, on the other hand, if the information written by the current is not stored, a non-volatile memory is not realized. That is, it is necessary to secure a stability (thermal stability) against the thermal fluctuation of the memory layer.

In the case of the memory element using magnetization inversion by spin injection, since the volume of the memory layer becomes small, simply considered the thermal stability tends to decrease, compared to the MRAM in the related art.

When thermal stability of the memory layer is not secured, the inverted magnetization direction re-inverts by heating, and this leads to writing error.

In addition, in a case where high capacity of the memory element using magnetization inversion by the spin injection is advanced, the volume of the memory element becomes smaller, such that the securing of the thermal stability becomes an important problem.

Therefore, in regard to the memory element using the magnetization inversion by spin injection, thermal stability is a very important characteristic.

Therefore, to realize a memory element having a configuration where the magnetization direction of the memory layer as a memory is inverted by spin injection, it is necessary to diminish the current necessary for the magnetization inversion by spin injection to a value equal to or less than the saturation current of the transistor, and thereby securing thermal stability for retaining written information reliably.

As described above, to diminish the current necessary for the magnetization inversion by spin injection, diminishing the saturated magnetization amount Ms of the memory layer, or making the memory layer thin may be considered. For example, as is the case with U.S. Pat. No. 7,242,045, it is effective to use a material having a small saturated magnetization amount Ms as the material for the memory layer. However, in this way, in a case where the material having the small saturated magnetization amount Ms is simply used, it is difficult to secure thermal stability for reliably retaining information.

Therefore, in this application, it is desirable to provide a memory element capable of improving thermal stability while diminishing the write current, and a memory device with the memory element.

According to an embodiment, there is provided a memory element including a layered structure. The layered structure includes a memory layer that has a magnetization perpendicular to a film face and a magnetization direction thereof varies corresponding to information, a magnetization-fixed layer that has a magnetization that is perpendicular to the film face and becomes a reference for the information stored in the memory layer, an insulating layer that is provided between the memory layer and the magnetization-fixed layer and is formed of a non-magnetic material, and a cap layer that is provided at a face side, which is opposite to the insulating layer-side face, of the memory layer. An electron that is spin-polarized is injected in a lamination direction of the layered structure, and thereby the magnetization direction of the memory layer varies and a recording of information is performed with respect to the memory layer, a magnitude of an effective diamagnetic field which the memory layer receives is smaller than a saturated magnetization amount of the memory layer, and at least a face, which comes into contact with the memory layer, of the cap layer is formed of a Ta film.

In addition, the memory layer may include Co—Fe—B.

In addition, the cap layer may be configured in such a manner that a non-magnetic film is laminated on the Ta film that comes into contact with the memory layer.

In addition, the Ta film, which comes into contact with the memory layer, of the cap layer may have a film thickness of 5 nm or less.

According to another embodiment, there is provided a memory device including a memory element that retains information through the magnetization state of a magnetic material, and two kinds of interconnects that intersect each other, wherein the memory element has the configuration of the above-described memory element according to the embodiment, the memory element is disposed between the two kinds of interconnects, and a current flows to the memory element in the lamination direction through the two kinds of interconnects, and thereby a spin-polarized electron is injected into the memory element.

According to the configuration of the memory element of the embodiment, a memory layer that retains information through a magnetization state of a magnetic material is provided, a magnetization-fixed layer is provided over the memory layer through an intermediate layer, the intermediate layer is formed of an insulating material, an electron that is spin-polarized is injected in a lamination direction and thereby the magnetization direction of the memory layer is changed and a recording of information is performed with respect to the memory layer, and therefore it is possible to perform the recording of the information by flowing a current in the lamination direction and by injecting a spin-polarized electron.

In addition, the magnitude of an effective diamagnetic field which the memory layer receives is smaller than a saturated magnetization amount of the memory layer, such that the diamagnetic field which the memory layer receives decreases, and therefore it is possible to diminish the amount of the write current necessary for inverting the magnetization direction of the memory layer.

On the other hand, it is possible to diminish the amount of the write current even when the saturated magnetization amount of the memory layer is not diminished, such that the saturated magnetization amount of the memory layer becomes sufficient, and it is possible to sufficiently secure thermal stability of the memory layer.

In addition, due to the structure of the cap layer, the Ta film comes into contact with the memory layer, such that perpendicular magnetic anisotropy is applied to the memory layer.

In addition, according to the configuration of the memory device of the embodiment, the memory element is disposed between the two kinds of interconnects, and a current flows to the memory element in the lamination direction through the two kinds of interconnects, and thereby a spin-polarized electron is injected into the memory element. Therefore, it is possible to perform the recording of information by a spin injection by flowing a current in the lamination direction of the memory element through the two kinds of interconnects.

In addition, even when the saturated magnetization amount is not diminished, it is possible to diminish the amount of the write current of the memory element, such that it is possible to stably retain the information recorded in the memory element and it is possible to diminish the power consumption of the memory device.

According to the embodiments, even when the saturated magnetization amount of the memory layer is not diminished, the amount of the write current of the memory element may be diminished, such that the thermal stability representing the information retaining ability is sufficiently secured, and it is possible to configure a memory element excellent in a characteristic balance. Therefore, it is possible to realize a memory device that operates stably with high reliability.

In addition, at least a face, which comes into contact with the memory layer, of the cap layer is formed of a Ta film, such that perpendicular magnetization is applied to the memory layer. Therefore, it is advantageous in an aspect of realizing a perpendicular magnetization-type MTJ.

In addition, the write current is diminished, such that it is possible to diminish power consumption while performing the writing into the memory element. Therefore, it is possible to diminish the power consumption of the entirety of the memory device.

Additional features and advantages are described herein, and will be apparent from the following Detailed Description and the figures.

BRIEF DESCRIPTION OF THE FIGURES

FIGS. 7A and 7B are explanatory views illustrating a layered structure and a measurement result of experiment 5 according to the embodiment;

DETAILED DESCRIPTION

Embodiments of the present application will be described below in detail with reference to the drawings.
1. Outline of Memory Element of Embodiment
2. Configuration of Embodiment
3. Experiment 1. Outline of Memory Element of Embodiment First, outline of a memory element of an embodiment according to the present application will be described.

The embodiment according to the present application performs the recording of information by inverting a magnetization direction of a memory layer of a memory element by the above-described spin injection.

The memory layer is formed of a magnetic material such as ferromagnetic layer, and retains information through the magnetization state (magnetization direction) of the magnetic material.

Figure 2:
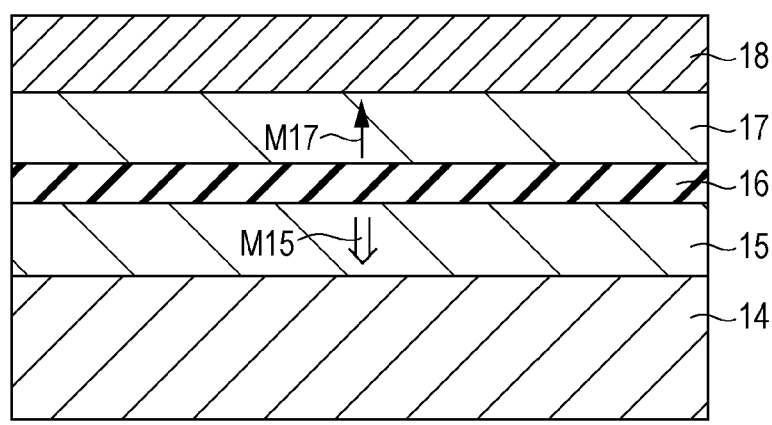
FIG. 2 is a cross-sectional view illustrating a memory element according the embodiment.

It will be described later in detail, but the memory element has a layered structure whose example is shown in FIG. 2, and includes a memory layer 17 and a magnetization-fixed layer 15 as two magnetic layers, and an insulating layer 16 (tunnel insulating layer) as an intermediate layer provided between the two magnetic layers. In addition, a cap layer 18 is provided at a face side, which is opposite to the insulating layer 16 side face, of the memory layer 17.

The memory layer 17 has a magnetization perpendicular to a film face and a magnetization direction varies corresponding to information.

The magnetization-fixed layer 15 has a magnetization that is a reference for the information stored in the memory layer 17 and is perpendicular to the film face.

The insulating layer 16 is formed of a non-magnetic material and is provided between the memory layer 17 and the magnetization-fixed layer 15. For example, the insulating layer 16 is formed of an oxide film such as MgO.

Spin-polarized electrons are injected in the lamination direction of a laminated structure having the magnetization-fixed layer 15, the insulating layer 16, the memory layer 17, and the cap layer 18, and the magnetization direction of the memory layer 17 is changed and thereby information is recorded in the memory layer 17.

In this embodiment, at least a face, which comes into contact with the memory layer 17, of the cap layer 18 formed at an upper side of the memory layer 17 is formed of a Ta film.

A basic operation for inverting the magnetization direction of the magnetic layer (memory layer 17) by spin injection is to make a current of a threshold value or greater flow to the memory element including a giant magnetoresistive effect element (GMR element) or a tunnel magnetoresistive effect element (MTJ element) in a direction perpendicular to a film face. At this time, the polarity (direction) of the current depends on the inverted magnetization direction.

In a case where a current having an absolute value less than the threshold value is made to flow, magnetization inversion does not occur.

A threshold value Ic of a current, which is necessary when the magnetization direction of the magnetic layer is inverted by spin injection, is expressed by the following equation (1).

$$Ic = A \cdot \alpha \cdot Ms \cdot V \cdot Hd / 2\eta \quad (1)$$

Here, A: constant, α: spin braking constant, spin injection efficiency, Ms: saturated magnetization amount, V: volume of memory layer, and Hd: effective diamagnetic field.

As expressed by the equation (1), a threshold value of a current may be set to an arbitrary value by controlling the volume V of the magnetic layer, the saturated magnetization Ms of the magnetic layer, and the spin injection efficiency η, and the spin braking constant α, In this embodiment, the memory element includes the magnetic layer (memory layer 17) that is capable of retaining information through the magnetization state, and the magnetization-fixed layer 15 whose magnetization direction is fixed.

The memory element has to retain written information so as to function as a memory. This is determined by a value of an index $\Delta (=KV/k_BT)$ of thermal stability as an index of ability of retaining information. The above-described $\Delta$ is expressed by the following equation (2).

$$\Delta = KV/k_BT = Ms \cdot V \cdot H_k \cdot (\tfrac{1}{2}k_BT) \quad (2)$$

Here, $H_k$: effective anisotropy field, $k_B$: Boltzmann's constant, T: temperature, Ms: saturated magnetization amount, and V: volume of memory layer.

The effective anisotropy field $H_k$ receives an effect by a shape magnetic anisotropy, an induced magnetic anisotropy, and a crystal magnetic anisotropy, or the like, and when assuming a coherent rotation model of a single domain, the effective anisotropy field becomes the same as the coercive force.

The index $\Delta$ of the thermal stability and the threshold value Ic of the current are often in a trade-off relationship. Therefore, compatibility of these becomes an issue to retain the memory characteristic.

In regard to the threshold value of the current that changes the magnetization state of the memory layer 17, actually, for example, in a TMR element in which the thickness of the memory layer 17 is 2 nm, and a planar pattern is substantially an elliptical shape of 100 nm×150 nm, a threshold value +Ic of a positive side is +0.5 mA, a threshold value −Ic of a negative side is −0.3 mA, and a current density at this time is substantially $3.5 \times 10^6$ A/cm². These substantially correspond to the above-described equation (1).

On the contrary, in a common MRAM that performs a magnetization inversion using a current magnetic field, a write current of several mA or more is necessary.

Therefore, in the case of performing magnetization inversion by spin injection, the threshold value of the above-described write current becomes sufficiently small, such that this is effective for diminishing power consumption of an integrated circuit.

Figure 10:
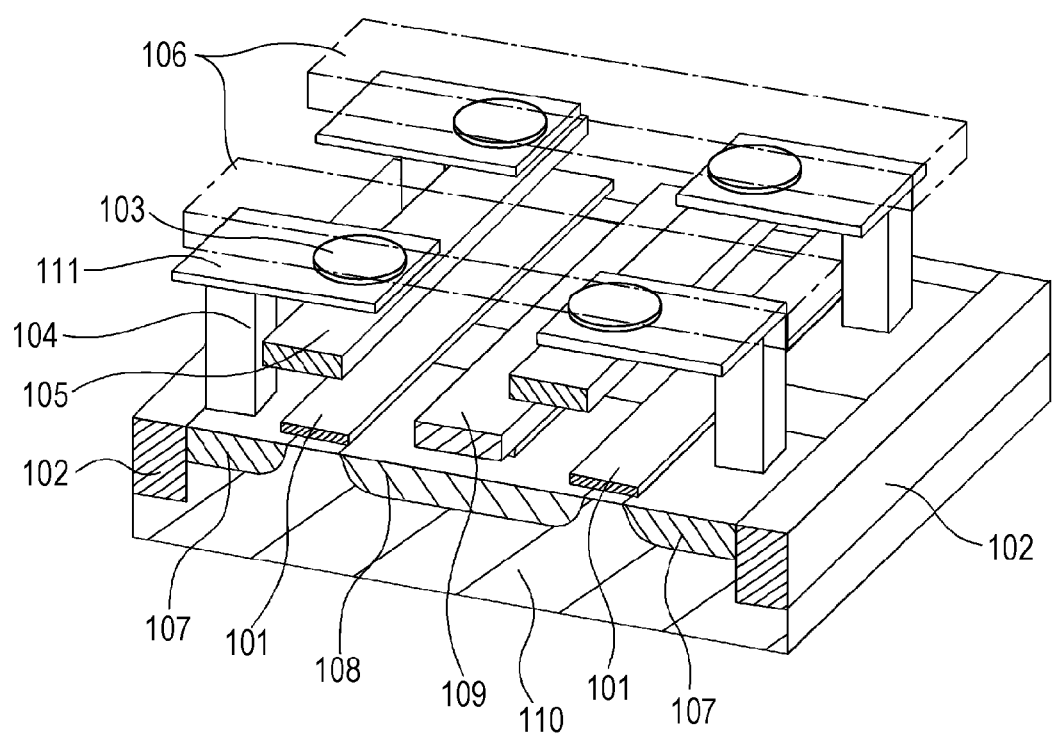
FIG. 10 is a perspective view schematically illustrating a configuration of an MRAM in the related art.
Figure 11:
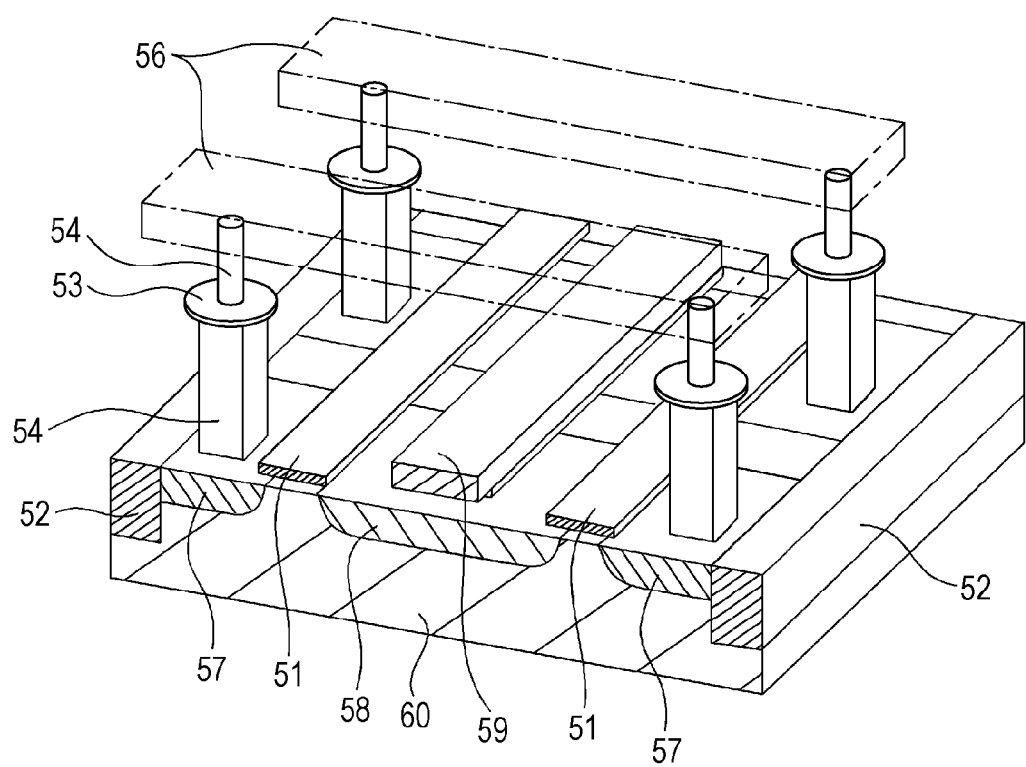
FIG. 11 is an explanatory view illustrating a schematic configuration of a memory device using a magnetic inversion by a spin injection.
Figure 12:
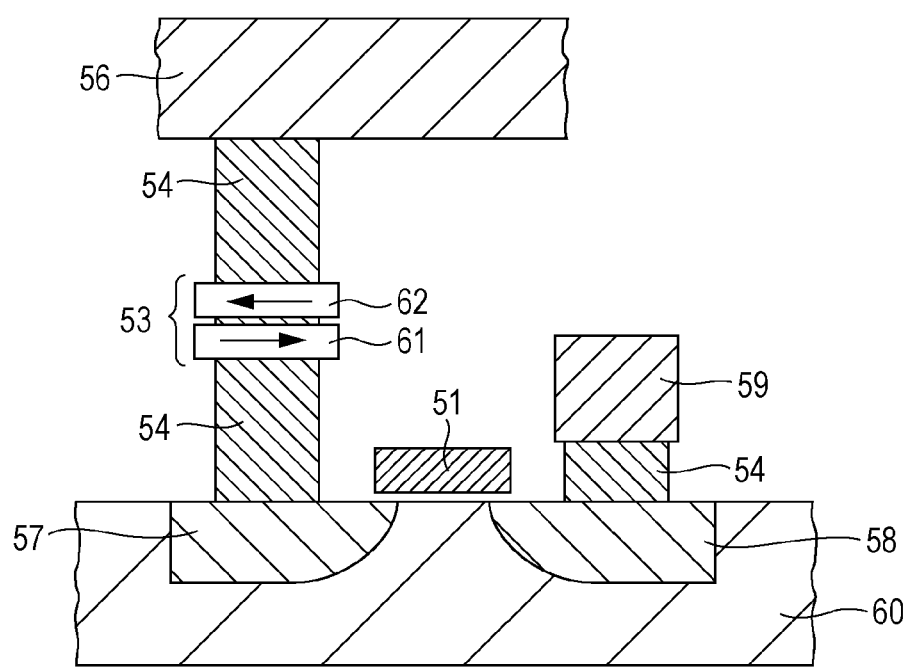
FIG. 12 is a cross-sectional view of a memory device of FIG. 11.

In addition, an interconnect (interconnect 105 of FIG. 10) for the generation of the current magnetic field, which is necessary for a common MRAM, is not necessary, such that in regard to the degree of integration, it is advantageous compared to the common MRAM.

In the case of performing the magnetization inversion by spin injection, since the writing (recording) of information is performed by directly flowing a current to the memory element, to select a memory cell that performs the writing, the memory element is connected to a selection transistor to construct the memory cell.

In this case, the current flowing to the memory element is restricted to a current magnitude (saturated current of the selection transistor) that can be made to flow to the selection transistor.

To make the threshold value Ic of a current of the magnetization inversion by the spin injection smaller than the saturated current of the selection transistor, as can be seen from the equation (1), it is effective to diminish the saturated magnetization amount Ms of the memory layer 17.

However, in the case of simply diminishing the saturated magnetization amount Ms (for example, U.S. Pat. No. 7,242,045), the thermal stability of the memory layer 17 is significantly deteriorated, and therefore it is difficult for the memory element to function as a memory.

To construct the memory, it is necessary that the index $\Delta$ of the thermal stability is equal to or greater than a magnitude of a certain degree.

The present inventors have made various studies, and as a result thereof, they have found that when for example, a composition of Co—Fe—B is selected as the ferromagnetic layer making up the memory layer 17, the magnitude of the effective diamagnetic field (Meffective) which the memory layer 17 receives becomes smaller than the saturated magnetization amount Ms of the memory layer 17.

By using the above-described ferromagnetic material, the magnitude of the effective diamagnetic field which the memory layer 17 receives becomes smaller than the saturated magnetization amount Ms of the memory layer 17.

In this manner, it is possible to make the diamagnetic field which the memory layer 17 receives small, such that it is possible to obtain an effect of diminishing the threshold value Ic of a current expressed by the equation (1) without deteriorating the thermal stability Δ expressed by the equation (2).

In addition, the present inventors have found that Co—Fe—B magnetizes in a direction perpendicular to a film face within a restricted composition range of the selected Co—Fe—B composition, and due to this, it is possible to secure a sufficient thermal stability even in the case of an extremely minute memory element capable of realizing Gbit class capacity.

Therefore, in regard to a spin injection-type memory of the Gbit class, it is possible to make a stable memory in which information may be written with a low current in a state where the thermal stability is secured.

In this embodiment, it is configured such that the magnitude of the effective diamagnetic field which the memory layer 17 receives is made to be less than the saturated magnetization amount Ms of the memory layer 17, that is, a ratio of the magnitude of the effective diamagnetic field with respect to the saturated magnetization amount Ms of the memory layer 17 becomes less than 1.

In addition, a magnetic tunnel junction (MTJ) element is configured by using a tunnel insulating layer (insulating layer 16) formed of an insulating material as the non-magnetic intermediate layer disposed between the memory layer 17 and the magnetization-fixed layer 15 in consideration of the saturated current value of the selection transistor.

The magnetic tunnel junction (MTJ) element is configured by using the tunnel insulating layer, such that it is possible to make a magnetoresistance change ratio (MR ratio) large compared to a case where a giant magnetoresistive effect (GMR) element is configured by using a non-magnetic conductive layer, and therefore it is possible to increase the read-out signal strength.

Particularly, when magnesium oxide (MgO) is used as the material of the tunnel insulating layer 16, it is possible to make the magnetoresistance change ratio (MR ratio) large compared to a case where aluminum oxide, which can be generally used, is used.

In addition, generally, spin injection efficiency depends on the MR ratio, and the larger the MR ratio, the more spin injection efficiency is improved, and therefore it is possible to diminish the magnetization inversion current density.

Therefore, when magnesium oxide is used as the material of the tunnel insulating layer 16 and the memory layer 17 is used, it is possible to diminish the threshold write current by spin injection and therefore it is possible to perform the writing (recording) of information with a small current. In addition, it is possible to increase the read-out signal strength.

In this manner, it is possible to diminish the threshold write current by spin injection by securing the MR ratio (TMR ratio), and it is possible to perform the writing (recording) of information with a small current. In addition, it is possible to increase the read-out signal strength.

As described above, in a case where the tunnel insulating layer 16 is formed of the magnesium oxide (MgO) film, it is desirable that the MgO film be crystallized and therefore a crystal orientation be maintained in (001) direction.

In addition, in this embodiment, in addition to a configuration formed of the magnesium oxide, the insulating layer 16 as an intermediate layer disposed between the memory layer 17 and the magnetization-fixed layer 15 may be configured by using, for example, various insulating materials, dielectric materials, and semiconductors such as aluminum oxide, aluminum nitride, $SiO_2$, $Bi_2O_3$, $MgF_2$, CaF, $SrTiO_2$, $AlLaO_3$, and Al—N—O.

An area resistance value of the tunnel insulating layer 16 is necessary to be controlled to several tens $\Omega\mu m2$ or less in consideration of the viewpoint of obtaining a current density necessary for inverting the magnetization direction of the memory layer 17 by spin injection.

In the tunnel insulating layer 16 formed of the MgO film, to retain the area resistance value within the above-described range, it is necessary to set the film thickness of the MgO film to 1.5 nm or less.

In addition, it is desirable to make the memory element small to easily invert the magnetization direction of the memory layer 17 with a small current.

Therefore, preferably, the area of the memory element is set to 0.01 μm2 or less.

In addition, in this embodiment, the memory layer 17 may be formed by directly laminating another ferromagnetic layer having a different composition. In addition, a ferromagnetic layer and a soft magnetic layer may be laminated, or a plurality of ferromagnetic layers may be laminated through a soft magnetic layer or a non-magnetic layer interposed therebetween. Even in the case of laminating in this manner, an effect may be obtained.

Particularly, in a case where the memory layer 17 is configured by laminating the plurality of ferromagnetic layers through the non-magnetic layer, it is possible to adjust the strength of interaction between the ferromagnetic layers, such that even when even when the dimensions of the memory element is under sub-micron, there is obtained an effect of controlling magnetization inversion current not to be large. As a material of the non-magnetic layer in this case, Ru, Os, Re, Ir, Au, Ag, Cu, Al, Bi, Si, B, C, Cr, Ta, Pd, Pt, Zr, Hf, W, Mo, Nb, or an alloy thereof may be used.

It is desirable that the magnetization-fixed layer 15 and the memory layer 17 have a unidirectional anisotropy. In addition, it is preferable that the film thickness of each of the magnetization-fixed layer 15 and the memory layer 17 be 0.5 to 30 nm.

Other configuration of the memory element may be the same as the configuration of a memory element that records information by spin injection in the related art.

The magnetization-fixed layer 15 may be configured in such a manner that the magnetization direction is fixed by only a ferromagnetic layer or by using an anti-ferromagnetic combination of an anti-ferromagnetic layer and a ferromagnetic layer.

In addition, the magnetization-fixed layer 15 may be configured by a single layer of a ferromagnetic layer, or a ferri-pin structure in which a plurality of ferromagnetic layers are laminated through a non-magnetic layer.

As a material of the ferromagnetic layer making up the magnetization-fixed layer 15 of the laminated ferri-pin structure, Co, CoFe, CoFeB, or the like may be used. In addition, as a material of the non-magnetic layer, Ru, Re, Ir, Os, or the like may be used.

As a material of the anti-ferromagnetic layer, a magnetic material such as an FeMn alloy, a PtMn alloy, a PtCrMn alloy, an NiMn alloy, an IrMn alloy, NiO, and Fe2O3 may be exemplified.

In addition, a magnetic characteristic may be adjusted by adding a non-magnetic element such as Ag, Cu, Au, Al, Si, Bi, Ta, B, C, O, N, Pd, Pt, Zr, Hf, Ir, W, Mo, and Nb to the above-describe magnetic materials, or in addition to this, various physical properties such as a crystalline structure, a crystalline property, a stability of a substance, or the like may be adjusted.

In addition, in relation to a film configuration of the memory element, the memory layer 17 may be disposed at the lower side of the magnetization-fixed layer 15, or at the upper side thereof, and in any disposition, there is no problem at all.

In addition, there is no problem at all in a case where the magnetization-fixed layer 15 is disposed at the upper side and the lower side of the memory layer 17, so-called dual-structure.

In addition, as a method of reading-out information recorded in the memory layer 17 of the memory element, a magnetic layer that becomes a reference for the information is provided on the memory layer 17 of the memory element through a thin insulating film, and the reading-out may be performed by a ferromagnetic tunnel current flowing through the insulating layer 16, or the reading-out may be performed by a magnetoresistive effect.

In addition, in this embodiment, at least an interface, which comes into contact with the memory layer 17, of the cap layer 18 is formed of a Ta film. For example, the cap layer 18 may be formed by only a Ta film having a predetermined film thickness, or a non-magnetic layer such as an Ru film and a Pt film may be laminated on the Ta film.

Since the Ta film of the cap layer 18 comes into contact with the memory layer 17, perpendicular magnetic anisotropy is applied to the memory layer 17. Due to this, it is easy for the memory layer 17 to become a perpendicular magnetization film. Therefore, it is more advantageous with regard to decrease in the write current and with regard to thermal stability.

2. Configuration of Embodiment

Subsequently, a specific configuration of this embodiment will be described.

Figure 1:
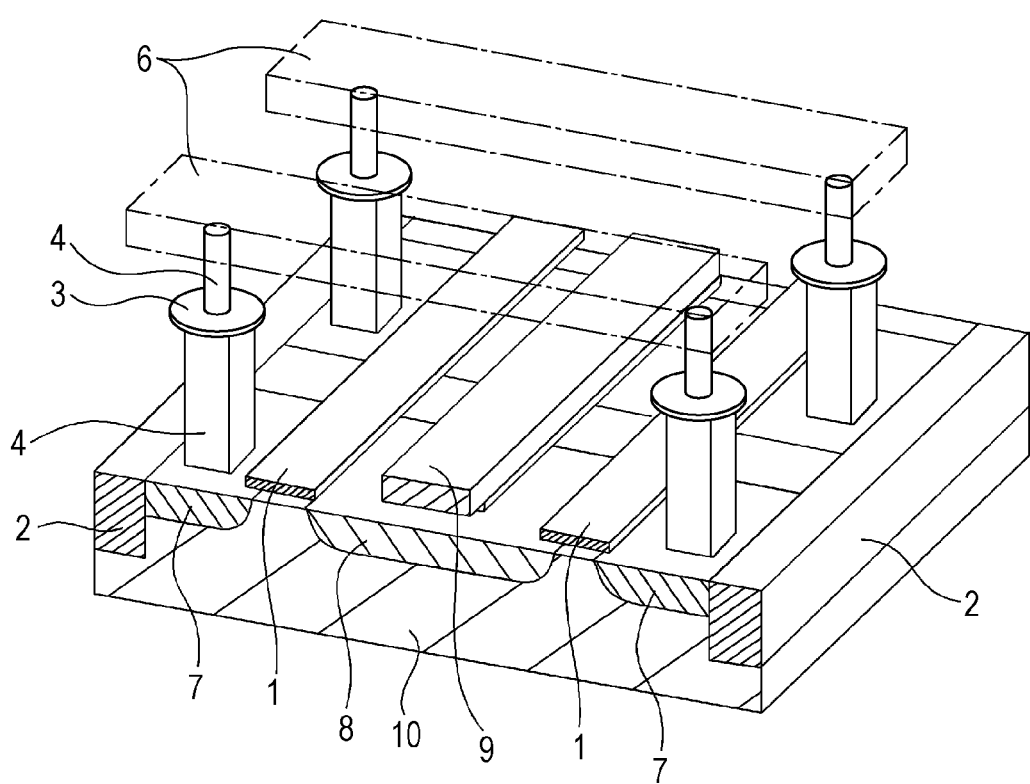
FIG. 1 is an explanatory view illustrating a schematic configuration of a memory device according to an embodiment.

As an embodiment, a schematic configuration diagram (perspective view) of a memory device is shown in FIG. 1.

This memory device includes a memory element 3, which can retain information at the magnetization state, disposed in the vicinity of an intersection of two kinds of address interconnects (for example, a word line and a bit line) that are perpendicular to each other.

Specifically, a drain region 8, a source region 7, and a gate electrode 1 that make up a selection transistor that selects each memory cell are formed in a portion separated by an element separation layer 2 of a semiconductor substrate 10 such as a silicon substrate, respectively. Among them, the gate electrode 1 also functions as one side address interconnect (for example, a word line) that extends in the front-back direction in the drawing.

The drain region 8 is formed commonly with left and right selection transistors in the drawing, and an interconnect 9 is connected to the drain region 8.

The memory element 3 is disposed between the source region 7, and the other side address interconnect (for example, a bit line) 6 that is disposed at the upper side and extends in the left-right direction in the drawing. This memory element 3 has a memory layer including a ferromagnetic layer whose magnetization direction is inverted by spin injection.

In addition, the memory element 3 is disposed in the vicinity of an intersection of two kinds of address interconnects 1 and 6.

The memory element 3 is connected to the bit line 6 and the source region 7 through upper and lower contact layers 4, respectively.

In this manner, a current flows into the memory element 3 in the perpendicular direction thereof through the two kind of address interconnects 1 and 6, and the magnetization direction of the memory layer may be inverted by a spin injection.

In addition, a cross-sectional view of the memory element 3 of the memory device according to this embodiment is shown in FIG. 2.

In the memory element 3, an underlying layer 14, the magnetization-fixed layer 15, the insulating layer 16, the memory layer 17, and the cap layer 18 are laminated in this order from a lower layer side.

In this case, the magnetization-fixed layer 15 is provided at a lower layer in relation to a memory layer 17 in which the magnetization direction of a magnetization M17 is inverted by a spin injection.

In regard to the spin injection type memory, "0" and "1" of information are defined by a relative angle between the magnetization M17 of the memory layer 17 and a magnetization M15 of the magnetization-fixed layer 15.

An insulating layer 16 that serves as a tunnel barrier layer (tunnel insulating layer) is provided between the memory layer 17 and the magnetization-fixed layer 15, and therefore an MTJ element is configured by the memory layer 17 and the magnetization-fixed layer 15.

In addition, an underlying layer 14 is formed under the magnetization-fixed layer 15, and a cap layer 18 is formed on the memory layer 17.

The memory layer 17 is formed of a ferromagnetic material having a magnetic moment in which the direction of a magnetization M17 is freely changed in a direction perpendicular to a film face. The magnetization-fixed layer 15 is formed of a ferromagnetic material having a magnetic moment in which a magnetization M15 is fixed in the direction perpendicular to the film face.

The storage of information is performed by a magnetization direction of the memory layer 17 having a unidirectional anisotropy. The writing of information is performed by applying a current in the direction perpendicular to the film face and by causing a spin torque magnetization inversion. In this way, the magnetization-fixed layer 15 is provided at a lower layer in relation to the memory layer 17 in which the magnetization direction is inverted by the spin injection, and serves as a reference for the memory information (magnetization direction) of the memory layer 17.

In this embodiment, Co—Fe—B is used for the memory layer 17 and the magnetization-fixed layer 15.

The magnetization-fixed layer 15 serves as the reference for the information, such that it is necessary that the magnetization direction does not vary, but it is not necessarily necessary to be fixed in a specific direction. The magnetization-fixed layer 15 may be configured in such a manner that migration becomes more difficult than in the memory layer 17 by making a coercive force large, by making the film thickness large, or by making a damping constant large compared to the memory layer 17.

In the case of fixing the magnetization, an anti-ferromagnetic material such as PtMn and IrMn may be brought into contact with the magnetization-fixed layer 15, or a magnetic material brought into contact with such an anti-ferromagnetic material may be magnetically combined through a non-magnetic material such as Ru, and thereby the magnetization-fixed layer 15 may be indirectly fixed.

In this embodiment, particularly, a composition of the memory layer 17 of the memory element 3 is adjusted such that a magnitude of an effective diamagnetic field which the memory layer 17 receives becomes smaller than the saturated magnetization amount Ms of the memory layer 17.

That is, a composition of a ferromagnetic material Co—Fe—B of the memory layer 17 is selected, and the magnitude of the effective diamagnetic field which the memory layer 17 receives is made to be small, such that the magnitude of the effective diamagnetic field becomes smaller than the saturated magnetization amount Ms of the memory layer 17.

In addition, in this embodiment, in a case where the insulating layer 16 that is an intermediate layer is formed of a magnesium oxide (MgO) layer. In this case, it is possible to make a magnetoresistive change ratio (MR ratio) high.

When the MR ratio is made to be high as described above, the spin injection efficiency is improved, and therefore it is possible to diminish a current density necessary for inverting the direction of the magnetization M17 of the memory layer 17.

In this embodiment, at least an interface, which comes into contact with the memory layer 17, of the cap layer 18 is formed of a Ta film.

As a material of the cap layer 18 that is laminated on the memory layer 17, Ta is used, and the Ta film comes into contact with the memory layer 17, such that perpendicular magnetization is applied to the memory layer 17. Therefore, it is easy to realize a perpendicular magnetization-type MTJ.

The memory element 3 of this embodiment can be manufactured by continuously forming from the underlying layer 14 to the cap layer 18 in a vacuum apparatus, and then by forming a pattern of the memory element 3 by a processing such as a subsequent etching or the like.

According to the above-described embodiment, the memory layer 17 of the memory element 3 is configured in such a manner that the magnitude of the effective diamagnetic field that the memory layer 17 receives is smaller than the saturated magnetization amount Ms of the memory layer 17, such that the diamagnetic field that the memory layer 17 receives is decreased, and it is possible to diminish an amount of the write current necessary for inverting the direction of the magnetization M17 of the memory layer 17.

On the other hand, since the amount of the write current may be diminished even when the saturated magnetization amount Ms of the memory layer 17 is not diminished, it is possible to sufficiently secure the saturated magnetization amount Ms of the memory layer 17 and therefore it is possible to sufficiently secure the thermal stability of the memory layer 17.

As described above, since it is possible to sufficiently secure the thermal stability that is an information retaining ability, it is possible to configure the memory element 3 excellent in a characteristic balance.

In this manner, an operation error is removed and an operation margin of the memory element 3 is sufficiently obtained, such that it is possible to stably operate the memory element 3.

Accordingly, it is possible to realize a memory device that operates stably with high reliability.

In addition, the Ta film of the cap layer 18 comes into contact with the memory layer 17, and therefore perpendicular magnetic anisotropy is applied to the memory layer 17, such that it is easy for the memory layer 17 to become a perpendicular magnetization film and it is advantageous with regard to decrease in a write current and with regard to thermal stability.

In addition, the write current is diminished, such that it is possible to diminish the power consumption when performing the writing into the memory element 3. Therefore, it is possible to diminish the power consumption of the entirety of the memory device in which a memory cell is configured by the memory element 3 of this embodiment.

Therefore, in regard to the memory device including the memory element 3 capable of realizing a memory device that is excellent in information retaining ability, has high reliability, and operates stably, it is possible to diminish the power consumption in a memory device including the memory element.

In addition, the memory device that includes a memory element 3 shown in FIG. 2 and has a configuration shown in FIG. 1 has an advantage in that a general semiconductor MOS forming process may be applied when the memory device is manufactured.

Therefore, it is possible to apply the memory device of this embodiment as a general purpose memory.

3. Experiment

Here, in regard to the configuration of the memory element of this embodiment, by specifically selecting the material of the ferromagnetic layer making up the memory layer 17, the magnitude of the effective diamagnetic field that the memory layer 17 receives was adjusted, and thereby a sample of the memory element 3 was manufactured, and then characteristics thereof was examined.

In an actual memory device, as shown in FIG. 1, a semiconductor circuit for switching or the like present in addition to the memory element 3, but here, the examination was made on a wafer in which only the memory element is formed for the purpose of investigating a magnetization inversion characteristic of the memory layer 17.

In addition, in the following experiments 1 to 4, investigation is made into a configuration where a magnitude of the effective diamagnetic field which the memory layer 17 receives is made to be small, and thereby the magnitude of an effective diamagnetic field which the memory layer receives is smaller than a saturated magnetization amount Ms of the memory layer 17, by selecting a composition of the ferromagnetic material, that is, Co—Fe—B of the memory layer 17.

In addition, in experiment 5, investigation is made into a material of the cap layer 18.

Experiment 1

A thermal oxide film having a thickness of 300 nm was formed on a silicon substrate having a thickness of 0.725 mm, and the memory element 3 having a configuration shown in FIG. 2 was formed on the thermal oxide film.

Specifically, in regard to the memory element 3 shown in FIG. 2, a material and a film thickness of each layer were selected as described below.

Underlying layer 14: Laminated film of a Ta film having a film thickness of 10 nm and a Ru film having a film thickness of 25 nm Magnetization-fixed layer 15: CoFeB film having a film thickness of 2.5 nm Tunnel insulating layer 16: Magnesium oxide film having a film thickness of 0.9 nm Memory layer 17: CoFeB film having the same composition as that of the magnetization-fixed layer Cap layer 18: Laminated film of a Ta film having a film thickness of 3 nm, a Ru film having a thickness of 3 nm, and a Ta film having a thickness of 3 nm Each layer was selected as described above, a Cu film (not shown) having a film thickness of 100 nm (serving as a word line described below) was provided between the underlying layer 14 and the silicon substrate.

In the above-described configuration, the ferromagnetic layer of the memory layer 17 was formed of a ternary alloy of Co—Fe—B, and a film thickness of the ferromagnetic layer was fixed to 2.0 nm.

Each layer other than the insulating layer 16 formed of a magnesium oxide film was formed using a DC magnetron sputtering method.

The insulating layer 16 formed of the magnesium oxide (MgO) film was formed using a RF magnetron sputtering method.

In addition, after forming each layer of the memory element 3, a heating treatment was performed in a magnetic field heat treatment furnace.

Next, after masking a word line portion by a photolithography, a selective etching by Ar plasma was performed with respect to a laminated film other than the word line portion, and thereby the word line (lower electrode) was formed.

At this time, a portion other than the word line was etched to the depth of 5 nm in the substrate.

Then, a mask of a pattern of the memory element 3 by an electron beam drawing apparatus was formed, a selective etching was performed with respect to the laminated film, and thereby the memory element 3 was formed. A portion other than the memory element 3 was etched to a portion of the word line immediately over the Cu layer.

In addition, in the memory element for the characteristic evaluation, it is necessary to make a sufficient current flow to the memory element so as to generate a spin torque necessary for the magnetization inversion, such that it is necessary to suppress the resistance value of the tunnel insulating layer. Therefore, a pattern of the memory element 3 was set to an elliptical shape having a short axis of 0.09 μm×a long axis of 0.18 μm, and an area resistance value ($\Omega\mu m^2$) of the memory element 3 was set to 20 $\Omega\mu m^2$.

Next, a portion other than the memory element 3 was insulated by sputtering Al2O3 to have a thickness of substantially 100 nm.

Then, a bit line serving as an upper electrode and a measurement pad were formed by using photolithography.

In this manner, a sample of the memory element 3 was manufactured.

By the above-described manufacturing method, each sample of the memory element 3 in which a composition of Co—Fe—B alloy of the ferromagnetic layer of the memory layer 17 was changed was manufactured.

In the composition of the Co—Fe—B alloy, a composition ratio of CoFe and B was fixed to 80:20, and a composition ratio of Co in CoFe, that is, x(atomic %) was changed to 90%, 80%, 70%, 60%, 50%, 40%, 30%, 20%, 10%, and 0%.

With respect to each sample of the memory element 3 manufactured as described above, a characteristic evaluation was performed as described below.

Before the measurement, it was configured to apply a magnetic field to the memory element 3 from the outside to control an inversion current in such a manner that a value in a plus direction and a value in a minus direction to be symmetric to each other.

In addition, a voltage applied to the memory element 3 was set up to 1 V within a range without breaking down the insulating layer 16.

Measurement of Saturated Magnetization Amount

The saturated magnetization amount Ms was measured by a VSM measurement using a Vibrating Sample Magnetometer.

Measurement of Effective Diamagnetic Field

As a sample for measuring an effective diamagnetic field, in addition to the above-described sample of the memory element 3, a sample in which each layer making up the memory element 3 was formed was manufactured and then the sample was processed to have a planar pattern of 20 mm×20 mm square.

In addition, a magnitude $M_{effective}$ of an effective diamagnetic field was obtained by FMR (Ferromagnetic Resonance) measurement.

A resonance frequency fFMR, which is obtained by the FMR measurement, with respect to arbitrary external magnetic field $H_{ex}$ is given by the following equation (3).

$$f_{FMR} = \gamma' \sqrt{4\pi M_{effective}(H_K + H_{ex})} \quad (3)$$

Here, $M_{effective}$ in the equation (3) may be expressed by $4\pi M_{effective} = 4\pi$ Ms−H⊥ (H⊥: anisotropy field in a direction perpendicular to a film face).

Measurement of Inversion Current Value and Thermal Stability

An inversion current value was measured for the purpose of evaluating the writing characteristic of the memory element 3 according to this embodiment.

A current having a pulse width of 10 μs to 100 ms is made to flow to the memory element 3, and then a resistance value of the memory element 3 was measured.

In addition, the amount of current that flows to the memory element 3 was changed, and then a current value at which a direction of the magnetization M17 of the memory layer 17 of the memory element 3 was inverted was obtained. A value obtained by extrapolating a pulse width dependency of this current value to a pulse width 1 ns was set to the inversion current value.

In addition, the inclination of a pulse width dependency of the inversion current value corresponds to the above-described index A of the thermal stability of the memory element 3. The less the inversion current value is changed (the inclination is small) by the pulse width, the more the memory element 3 is strengthened against thermal disturbance.

In addition, twenty memory elements 3 with the same configuration were manufactured to take variation in the memory element 3 itself into consideration, the above-described measurement was performed, and an average value of the inversion current value and the index Δ of the thermal stability were obtained.

In addition, an inversion current density Jc0 was calculated from the average value of the inversion current value obtained by the measurement and an area of the planar pattern of the memory element 3.

In regard to each sample of the memory element 3, a composition of Co—Fe—B alloy of the memory layer 17, measurement results of the saturated magnetization amount Ms and the magnitude $M_{effective}$ of the effective diamagnetic field, and a ratio $M_{effective}$/Ms of effective diamagnetic field to the saturated magnetization amount were shown in Table 1. Here, an amount x of Co of Co—Fe—B alloy of the memory layer 17 described in Table 1 was expressed by an atomic %.

TABLE 1

|  | Ms(emu/cc) | Meffctive(emu/cc) | Meffective/Ms |
|---|---|---|---|
| $(Co_{90}Fe_{10})_{80}$—$B_{20}$ | 960 | 1210 | 1.26 |
| $(Co_{80}Fe_{20})_{80}$—$B_{20}$ | 960 | 1010 | 1.05 |
| $(Co_{70}Fe_{30})_{80}$—$B_{20}$ | 1040 | 900 | 0.87 |
| $(Co_{60}Fe_{40})_{80}$—$B_{20}$ | 1200 | 830 | 0.69 |
| $(Co_{50}Fe_{50})_{80}$—$B_{20}$ | 1300 | 690 | 0.53 |
| $(Co_{40}Fe_{60})_{80}$—$B_{20}$ | 1300 | 500 | 0.38 |
| $(Co_{30}Fe_{70})_{80}$—$B_{20}$ | 1260 | 390 | 0.31 |
| $(Co_{20}Fe_{80})_{80}$—$B_{20}$ | 1230 | 360 | 0.29 |
| $(Co_{10}Fe_{90})_{80}$—$B_{20}$ | 1200 | 345 | 0.29 |
| $Fe_{80}$—$B_{20}$ | 1160 | 325 | 0.28 |

From the table 1, in a case where the amount x of Co in $(Co_xFe_{100-x})_{80}B_{20}$ was 70% or less, the magnitude of the effective diamagnetic field ($M_{effective}$) was smaller than the saturated magnetization amount Ms, that is, the ratio of $M_{effective}$/Ms in a case where the amount x of Co was 70% or less became a value less than 1.0.

In addition, it was confirmed that the more the amount x of Co decreased, the larger the difference between $M_{effective}$ and Ms.

Figure 3:
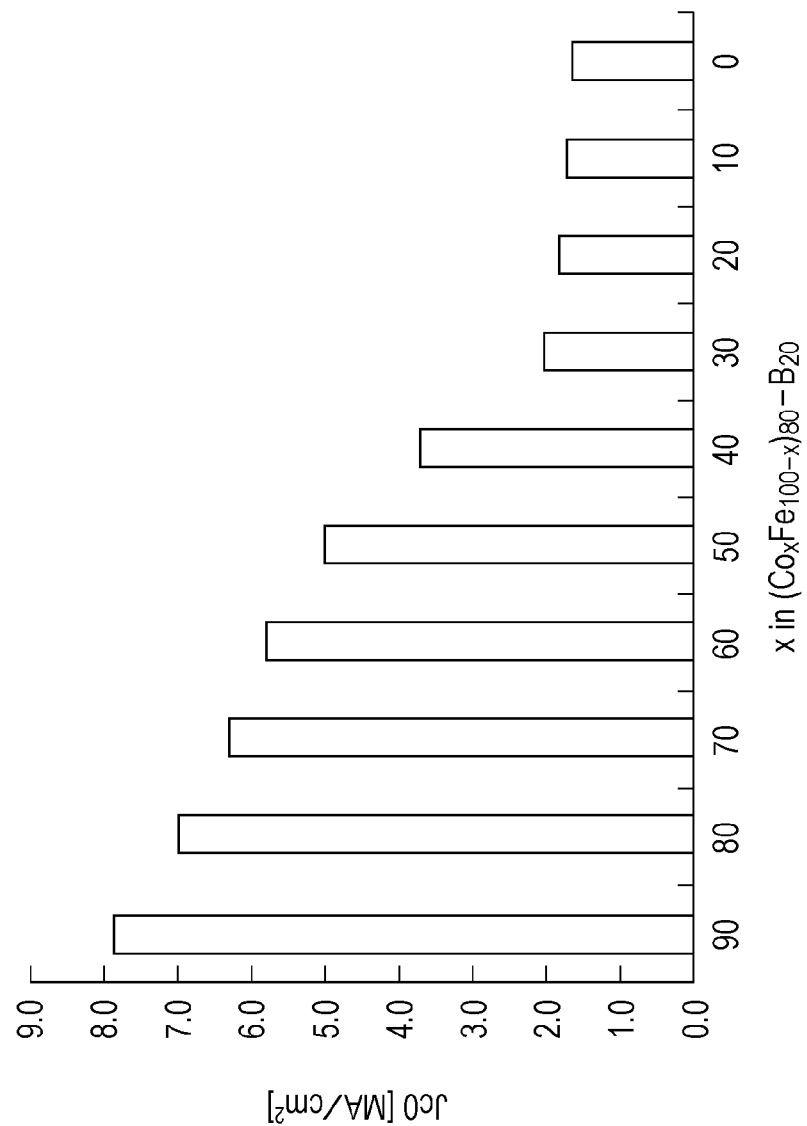
FIG. 3 is a diagram illustrating a relationship between an amount of Co of a memory layer of 0.09×0.18 μm size and an inversion current density.
Figure 4:
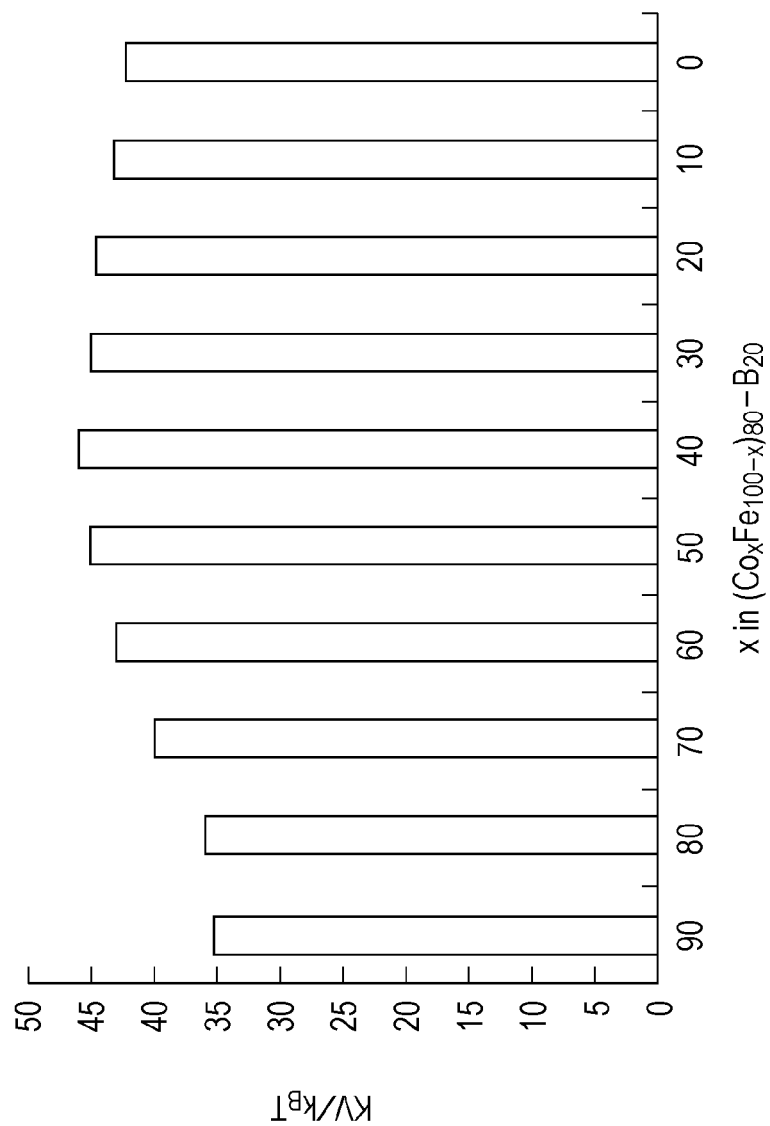
FIG. 4 is a diagram illustrating a relationship between an amount of Co of a memory layer of 0.09×0.18 μm size and an index of thermal stability.

A measurement result of the inversion current value was shown in FIG. 3, and a measurement result of the index of the thermal stability was shown in FIG. 4.

FIG. 3 shows a relationship between the amount x (content in CoFe; atomic %) of Co in the Co—Fe—B alloy of the memory layer 17 and the inversion current density Jc0 obtained from the inversion current value.

FIG. 4 shows a relationship between an amount x (content in CoFe; atomic %) of Co in the Co—Fe—B alloy of the memory layer 17 and the index $\Delta(KV/k_BT)$ of the thermal stability.

As can be seen from FIG. 3, as the amount x of Co decreases, the inversion current density Jc0 decreases.

This is because in a case where the amount x of Co becomes small, the saturated magnetization amount Ms increases, but the effective diamagnetic field $M_{effective}$ decreases, and therefore the product of them Ms×$M_{effective}$ becomes small.

As can be seen from FIG. 4, as the amount x of Co decreased, the index $\Delta(=KV/k_BT)$ of the thermal stability increased, and in a case where the amount x of Co became more or less small to a degree, the index $\Delta$ of the thermal stability became stable to a large value.

This well corresponds to a change that is expected from the measurement result of the saturated magnetization amount Ms shown in Table 1 and a tendency where the index $\Delta$ of the thermal stability from the equation (2) is proportional to the saturated magnetization amount Ms.

As was clear from the results of Table 1, FIGS. 3 and 4, in a composition where the amount x of Co was 70% or less and the effective diamagnetic field $M_{effective}$ was less than the saturated magnetization amount Ms, it was possible to diminish the inversion current value Jc0 with a high thermal stability maintained, without using a method in which Ms was decreased and therefore the thermal stability was sacrificed.

Experiment 2

As can be seen from the Experiment 1, in the case of $(Co_xFe_{100-x})_{80}B_{20}$, it was possible to diminish the inversion current value Jc0 with a high thermal stability maintained in a composition where the amount x of Co was 70% or less.

Therefore, in experiment 2, an effect on a ratio of Co and Fe, and the $M_{effective}$/Ms, which was caused by an amount z of B, was examined by using a memory layer 17 having a composition $(Co_{70}Fe_{30})_{80}B_z$ and a composition $(Co_{80}Fe_{20})_{80}B_z$. The details of a sample were substantially the same as those in the experiment 1.

Table 2 shows compositions of CoFeB alloy in which the amount z of B was set to 5 to 40% in $(Co_{70}Fe_{30})_{100-z}B_z$, results of measurement of the saturated magnetization amount Ms and the magnitude $M_{effective}$ the effective diamagnetic field, and a ratio $M_{effective}$/Ms of the saturated magnetization amount and the magnitude of the effective diamagnetic field.

In addition, Table 3 shows compositions of CoFeB alloy in which the amount z (atomic %) of B was similarly set to 5 to 40% in $(Co_{80}Fe_{20})_{100-z}B_z$, and a ratio $M_{effective}$/Ms of the saturated magnetization amount Ms and the magnitude $M_{effective}$ of the effective diamagnetic field.

TABLE 2

| | Ms(emu/cc) | Meffective(emu/cc) | Meffective/Ms |
|---|---|---|---|
| $(Co_{70}Fe_{30})_{95}$—$B_5$ | 1310 | 1090 | 0.83 |
| $(Co_{70}Fe_{30})_{90}$—$B_{10}$ | 1250 | 1080 | 0.89 |
| $(Co_{70}Fe_{30})_{80}$—$B_{20}$ | 1040 | 900 | 0.87 |
| $(Co_{70}Fe_{30})_{70}$—$B_{30}$ | 820 | 730 | 0.89 |
| $(Co_{70}Fe_{30})_{60}$—$B_{40}$ | 450 | 690 | 1.53 |

TABLE 3

| | Ms(emu/cc) | Meffective(emu/cc) | Meffective/Ms |
|---|---|---|---|
| $(Co_{80}Fe_{20})_{95}$—$B_5$ | 1250 | 1280 | 1.02 |
| $(Co_{80}Fe_{20})_{90}$—$B_{10}$ | 1100 | 1140 | 1.04 |
| $(Co_{80}Fe_{20})_{80}$—$B_{20}$ | 960 | 1010 | 1.05 |
| $(Co_{80}Fe_{20})_{70}$—$B_{30}$ | 750 | 890 | 1.19 |
| $(Co_{80}Fe_{20})_{60}$—$B_{40}$ | 430 | 690 | 1.60 |

From the results of Table 2, it can be confirmed that in a case where the ratio of Co and Fe was set to 70/30 like $(Co_{70}Fe_{30})_{100-z}B_z$, the magnitude $M_{effective}$ of the effective diamagnetic field was smaller than the saturated magnetization amount Ms in compositions other than a composition where the amount z of B was 40 atomic %.

From the results of Table 3, it can be confirmed that in a case where the ratio of Co and Fe was set to 80/20 like $(Co_{80}Fe_{20})_{100-z}B_z$, the magnitude $M_{effective}$ of the effective diamagnetic field was larger than the saturated magnetization amount Ms in all compositions.

From the results of the above-described Tables 1 to 3, it was revealed that in a case where the amount z of B is within a range of 30 atomic % or less, a magnitude correlation of the saturated magnetization amount Ms and the magnitude $M_{effective}$ of the effective diamagnetic field is determined by the ratio of Co and Fe.

Therefore, a composition of the Co—Fe—B alloy where the magnitude $M_{effective}$ of the effective diamagnetic field is less than the amount of the saturated magnetization Ms in the memory layer 17 is as follows:

$(Co_x$—$Fe_y)_{100-z}$—$B_z$,

Here, $0 \leq Co_x \leq 70$,
$30 \leq Fe_y \leq 100$,
$0 < B_z \leq 30$.

Experiment 3

In a spin injection type memory of the Gbit class, it was assumed that the size of the memory element is 100 nm$\phi$ or less. Therefore, in experiment 3, the thermal stability was evaluated by using a memory element having the size of 50 nm$\phi$.

In the composition of Co—Fe—B alloy, a composition ratio (atomic %) of CoFe and B was fixed to 80:20, and a composition ratio x (atomic %) of Co in CoFe was changed to 90%, 80%, 70%, 60%, 50%, 40%, 30%, 20%, 10%, and 0%.

The details of the sample other than the sample size were substantially the same as those in the experiment 1.

Figure 5:
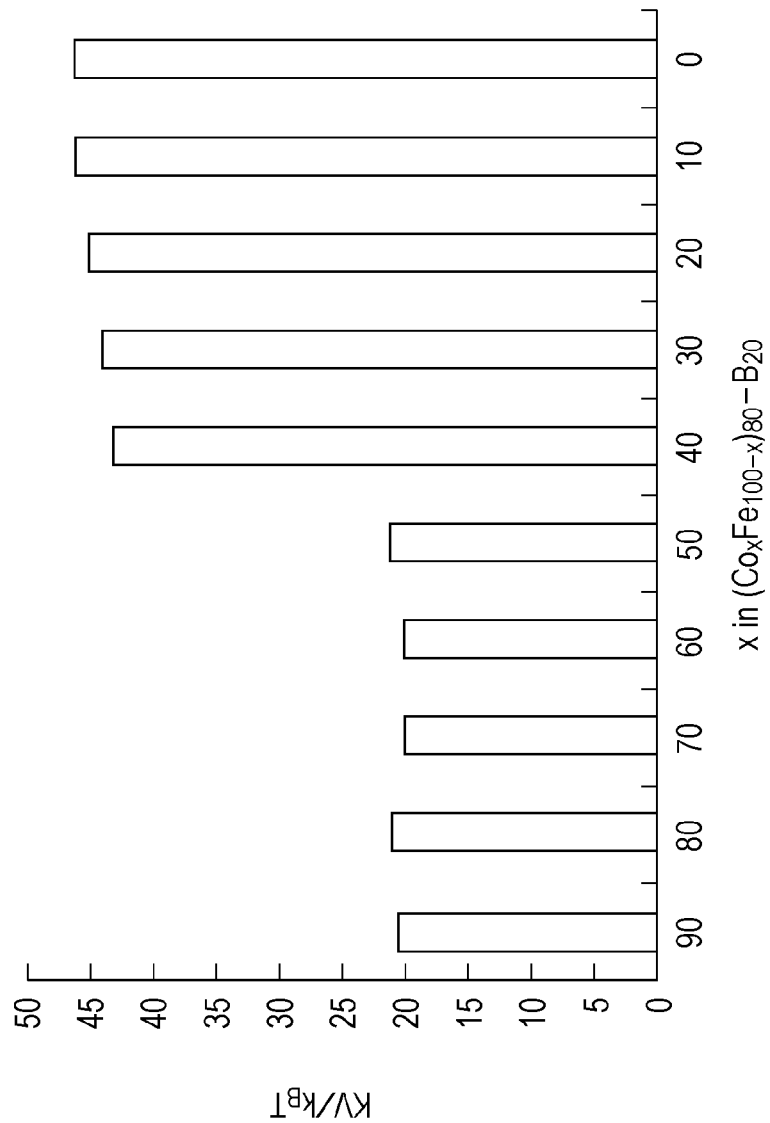
FIG. 5 is a diagram illustrating a relationship between an amount of Co of a memory layer of 50 nm φ size and an index of thermal stability.

In a case where the size of the memory element 3 was 50 nm$\phi$, a relationship between an amount of Co (content in CoFe; atomic %) in the Co—Fe—B alloy, and the index $\Delta(KV/k_BT)$ of thermal stability were shown in FIG. 5.

As can be seen from FIG. 5, when the element size was 50 nm$\phi$, Co—Fe—B alloy composition dependency of the thermal stability index $\Delta$ was largely varied from the Co—Fe—B alloy composition dependency of Δ obtained in the elliptical memory element having a short axis of 0.09 μm×a long axis of 0.18 μm shown in FIG. 4.

According to FIG. 5, the high thermal stability was maintained only in the case of Co—Fe—B alloy composition where Fe is 60 atomic % or more.

As a result of various reviews, it was clear that the reason why the Co—Fe—B alloy containing Fe of 60 atomic % or more shows the high thermal stability Δ in the extremely minute memory element was revealed to be because the magnetization of the Co—Fe—B alloy faced a direction perpendicular to a film face.

The reason why the magnetization of the Co—Fe—B alloy faces the direction perpendicular to the film face is considered to be because of a composition in which the magnitude $M_{effective}$ of the effective diamagnetic field is significantly smaller than the saturated magnetization amount Ms.

In addition, the reason why the thermal stability is secured even in the case of the extremely minute element of a perpendicular magnetization film is related to Hk (effective anisotropy field) in the equation (2), and Hk of the perpendicular magnetization film becomes a value significantly larger than that in the in-plane magnetization film. That is, in the perpendicular magnetization film, due to an effect of large Hk, it is possible to maintain a high thermal stability Δ even in the case of the extremely minute element not capable of securing a sufficient thermal stability Δ in the in-plane magnetization film.

From the above-described experiment results, in regard to the Co—Fe—B alloy having a composition of $(Co_xFe_{100-x})_{80}B_{20}$, in a case where the amount of $Fe_{100-x}$ is 60% or more, this alloy may be said to be suitable for the memory device of the Gbit class using the spin injection.

Experiment 4

As can be seen from the above-described experiment 3, in a case the amount of Fe was 60 or more in the Co—Fe—B alloy having a composition of $(Co_xFe_{100-x})_{80}B_{20}$, this alloy was suitable for the memory device of the Gbit class using the spin injection. In experiment 4, a memory element having the size of 50 nmφ was manufactured using the Co—Fe—B alloy containing B in an amount of 5 to 30 atomic %, and the thermal stability was evaluated.

The details other than the element size were substantially the same as those in the experiment 1.

A relationship between the index $\Delta(KV/k_BT)$ of the thermal stability and the Co—Fe—B alloy having a composition $(Co_xFe_{100-x})_{100-z}B_z$ in which an amount x of Co was 50, 40, 30, 20, 10, and 0, and an amount z of B was 5, 10, 20, and 30 was shown in Table 4.

As can be seen from Table 4, the thermal stability Δ in all compositions except that a case where the amount x of Co was 50, and the amount z of B was 5 to 30 was maintained to be large.

That is, as is the case with the result of the experiment 4, it was revealed that the amount x of Co of 50 and 60 became a boundary line for securing high thermal stability in an extremely minute element corresponding to the spin injection type memory of the Gbit class.

Therefore, from the above-described result, it was revealed that the Co—Fe—B alloy of the memory layer 17 was suitable for manufacturing the spin injection type memory of the Gbit class in the following composition:

$(Co_x$—$Fe_y)_{100-z}$—$B_z$,

Here, $0 \leq Co_x \leq 40$,
$60 \leq Fe_y \leq 100$,
$0 < B_z \leq 30$.

In addition, in regard to the Co—Fe—B alloy, in a composition where the ratio of Fe was great in Co and Fe, the difference between the $M_{effective}$ and Ms becomes large, and this alloy is apt to be magnetized, and therefore it is easy to secure thermal stability.

Therefore, in a case where the capacity of the magnetic memory increases and the size of the memory element 3 decreases, it is easy to secure thermal stability in the Co—Fe—B alloy containing a large amount of Fe.

Therefore, for example, in consideration of a situation in which the spin injection type magnetic memory of the Gbit class is realized by the memory layer 17 in which the amount y of Fe is 60, and the size thereof is 70 nmφ, it is preferable that whenever the diameter of the memory element 3 decreases by 5 nmφ, the amount y of Fe in the Co—Fe—B alloy increase by a value of 5.

For example, in the case of the $(Co_x$—$Fe_y)_{100-z}$—$B_z$, the amount y of Fe is set in such a manner that an atomic % as a content in CoFe is 65%, 70%, 75%, 80%, . . . (in terms of the amount x of Co, 35%, 30%, 25%, 20%, . . . ), and this is a more appropriate example to correspond to the size reduction of the memory element.

Experiment 5

Next, various samples in which a material of the cap layer 18 was changed was manufactured, and an investigation was made into an appropriate structure of the cap layer 18.

Figure 6A:
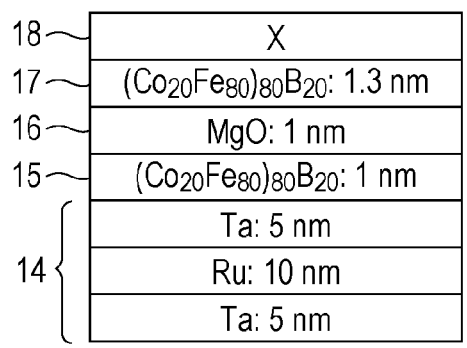
FIGS. 6A and 6B are explanatory views illustrating a layered structure and a measurement result of experiment 5 according to the embodiment.

A thermal oxide film having the thickness of 300 nm was formed on a silicon substrate having the thickness of 0.725 mm, and a magnetic multi-layered film shown in FIG. 6A was formed on the thermal oxide film.

TABLE 4

| | $(Co_{50}$—$Fe_{50})_{100-z}$—$B_z$ | $(Co_{40}$—$Fe_{60})_{100-z}$—$B_z$ | $(Co_{30}$—$Fe_{70})_{100-z}$—$B_z$ | $(Co_{20}$—$Fe_{80})_{100-z}$—$B_z$ | $(Co_{10}$—$Fe_{90})_{100-z}$—$B_z$ | $Fe_{100-z}$—$B_z$ |
|---|---|---|---|---|---|---|
| $B_z = 5$ atomic % | 19 | 40 | 42 | 42 | 43 | 44 |
| $B_z = 10$ atomic % | 20 | 41.5 | 43 | 44 | 44 | 45 |
| $B_z = 20$ atomic % | 20 | 43 | 44 | 45 | 46 | 46 |
| $B_z = 30$ atomic % | 21 | 45 | 47 | 48 | 48 | 48 |

In this case, this sample was configured by a Ta film (5 nm), an Ru film (10 nm), a Ta film (5 nm), a $(Co_{20}Fe_{80})_{80}B_{20}$ film (1 nm), an MgO film (1 nm), a $(Co_{20}Fe_{80})_{80}B_{20}$ film (1.3 nm), and a layer formed of a material X in this order from an underlying film side.

In this case, this configuration is a magnetic multi-layered film model in which from a lower side, the Ta film, the Ru film, and the Ta film correspond to the underlying layer 14, the lower side $(Co_{20}Fe_{80})_{80}B_{20}$ film corresponds to the magnetization-fixed layer 15, the MgO film corresponds to the insulating layer 16, and the upper side $(Co_{20}Fe_{80})_{80}B_{20}$ film corresponds to the memory layer 17.

After forming the magnetic multi-layered film, a heating treatment was performed in a magnetic field heat treatment furnace.

Then, in regard to the layer indicated by the material X, which corresponds to the cap layer 18, in the drawing, a sample in which this layer was formed of an Ru film of 5 nm, and a sample in which this layer was formed of a Ta film of 5 nm were manufactured, and then a Kerr measurement was performed with respect to each sample and a magnetic characteristic was examined.

Figure 6B:
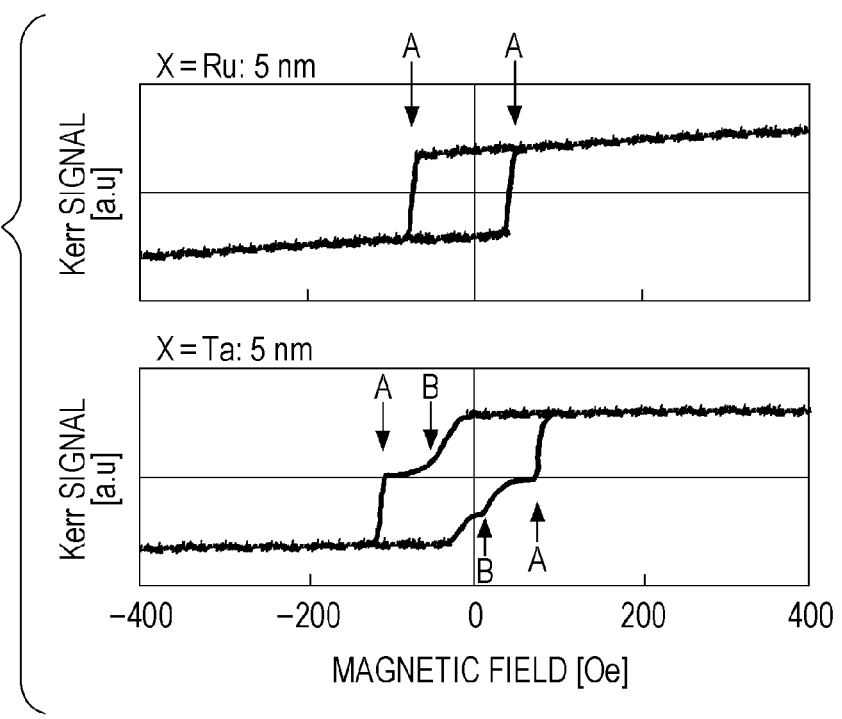

Measurement results with respect a case where the cap layer 18 was formed of the Ru film (5 nm), and a case where the cap layer 18 was formed of the Ta film (5 nm) are shown in FIG. 6B.

In the case of the Ru film, a magnetization inversion step has only one stage (a portion indicated by an arrow A). This is caused by the lower side CoFeB layer (magnetization-fixed layer 15), and this shows that the upper side CoFeB layer (memory layer 17) is not perpendicularly magnetized.

On the other hand, in a case where the cap layer 18 is formed of the Ta film, the magnetization inversion step has two stages, that is, a portion indicated by an arrow A and a portion indicated by an arrow B. The portion indicated by the arrow B shows magnetization inversion in the memory layer 17.

That is, when the cap layer 18 is formed of the Ta film, the upper side and lower side CoFeB layers are perpendicularly magnetized.

As can be seen from this result, when Ta is used for the cap layer, it is possible to realize a perpendicular magnetization-type MTJ.

Next, as shown in FIG. 7A, a measurement was performed using samples in which the cap layer 18 had a laminated structure of a Ta film and an Ru film was manufactured In addition, in regard to the cap layer 18, samples in which the Ta film that brought into contact with the memory layer 17 had a film thickness of 5 nm, 3 nm, and 1 nm were used.

Measurement results are shown in FIG. 7B.

As the Ta film thickness decreases, a separation (a portion indicated by an arrow A, and a portion indicated by an arrow B) of magnetization inversion step becomes clear, and the perpendicular magnetization of the upper side CoFeB (memory layer 17) is strengthened.

From these results, it can be seen that it is preferable that the film thickness of the Ta film of the cap layer 18 be 5 nm or less.

The cap layer 18 may be formed by further laminating another material on the Ta film/Ru film.

Figure 8A:
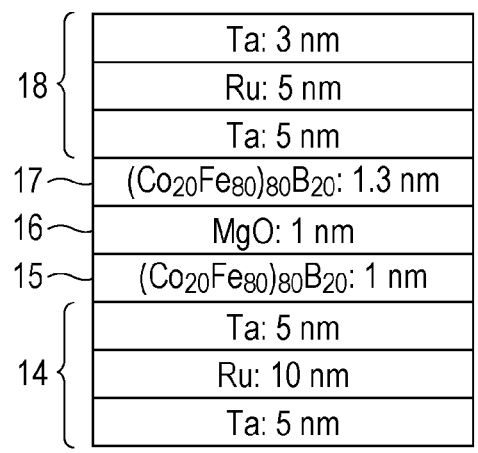
FIGS. 8A and 8B are explanatory views illustrating a layered structure and a measurement result of experiment 5 according to the embodiment.
Figure 8B:
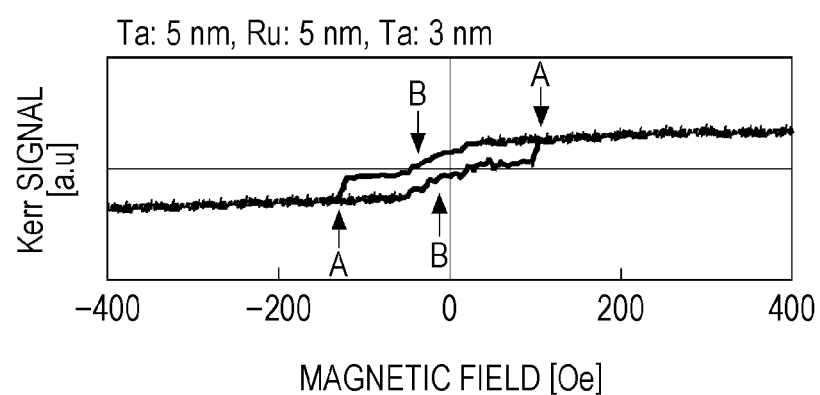

A measurement was performed with respect to samples in which the cap layer 18 had a laminated structure of, for example, a Ta film of 5 nm, an Ru film of 5 nm, and a Ta film of 3 nm as shown in FIG. 8A, and the measurement results as shown in FIG. 8B was obtained.

In this case, two-stages magnetization inversion is also shown as portions indicated by arrows A and B, the upper side and lower side CoFeB layers are perpendicularly magnetized.

In addition, another material to be laminated with the Ta film was investigated. For example, a case using Pt is shown in FIGS. 9A to 9D.

Figure 9A:
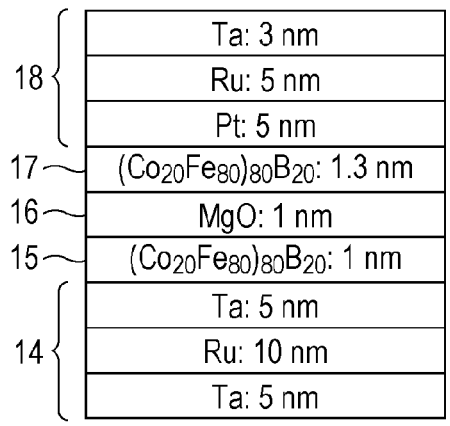
FIGS. 9A to 9D are explanatory views illustrating a layered structure and a measurement result of experiment 5 according to the embodiment.

In a sample shown in FIG. 9A, the cap layer 18 includes a Pt film of 5 nm, an Ru film of 3 nm, and Ta film of 5 nm. Pt film comes into contact with the memory layer 17.

Figure 9B:
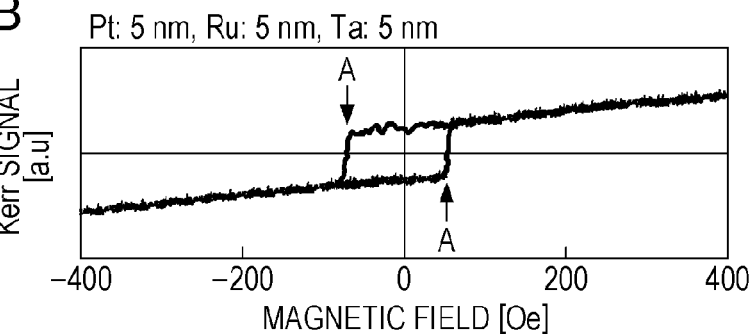

In this case, measurement results shown in FIG. 9B were obtained. From the measurement results, it can be seen that magnetization inversion shows only one stage (portion indicated by an arrow A), and the upper side CoFeB layer (memory layer 17) is not perpendicularly magnetized.

Figure 9C:
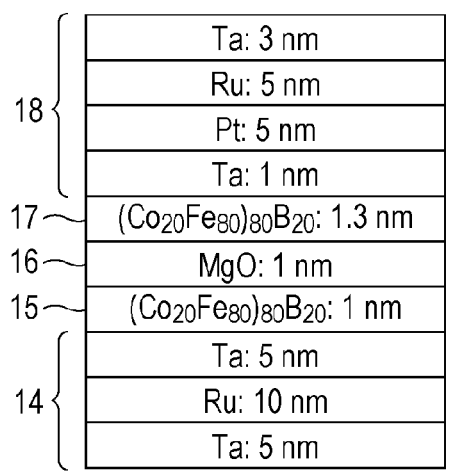

On the other hand, in a sample shown in FIG. 9C, the cap layer 18 includes a Ta film of 1 nm, a Pt film of 5 nm, an Ru film of 5 nm, and a Ta film of 3 nm. The Ta film comes into contact with the memory layer 17.

Figure 9D:
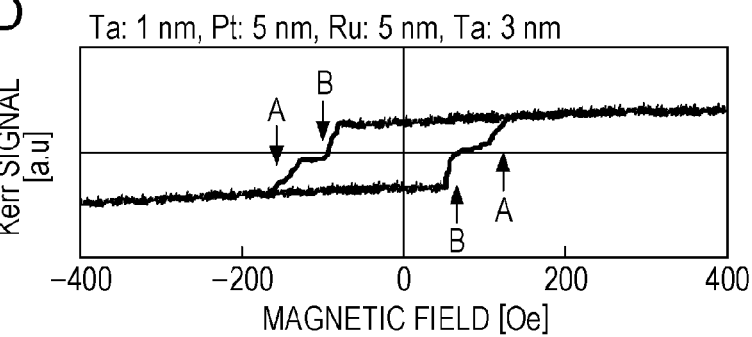

In this case, a measurement result shown in FIG. 9D was obtained. Here, two-stages (a portion indicated by an arrow A and a portion indicated by an arrow B) magnetization inversion was shown, and it was confirmed that the upper side and lower side CoFeB layers (the magnetization-fixed layer 15 and the memory layer 17) were perpendicularly magnetized.

From the above-described results of the experiment 5, it can be understood that the using of Ta film for the cap layer 18 is suitable for realizing the perpendicular magnetization-type MTJ.

In addition, it is preferable that the thickness of the Ta film be 5 nm or less, and more preferably, 3 nm or 1 nm.

In addition, even as the cap layer 18 is formed by laminating a non-magnetic film such as Ru and Pt, there is not problem. However, it is necessary that at least a face that comes into contact with the memory layer is formed of a Ta film.

Hereinbefore, the embodiment is described, but the present application is not limited to the above-described embodiment, and it is possible to adopt various layer configurations.

For example, in the embodiment, the Co—Fe—B composition of the memory layer 17 and the magnetization-fixed layer 15 was made to be the same as each other, but it is not limited to the above-described embodiment, and various configurations may be made without departing from the scope.

In addition, the underlying layer 14 may be formed of a single material, or may be formed by a laminated structure of a plurality of materials.

In addition, in this embodiment, the magnetization-fixed layer 15 may be formed by a single layer, or may use a laminated ferri-pin structure including two ferromagnetic layers and a non-magnetic layer. In addition, a structure in which anti-ferromagnetic film is applied to the laminated ferri-pin structure film is possible.

In addition, a film configuration of the memory element may be a configuration in which the memory layer 17 is disposed at an upper side of the magnetization-fixed layer 15 or a configuration in which the memory layer 17 is disposed at a lower side.

In addition, this film configuration may be a so-called dual structure in which the magnetization-fixed layer 15 is disposed at the upper side and the lower side of the memory layer 17.

It should be understood that various changes and modifications to the presently preferred embodiments described herein will be apparent to those skilled in the art. Such changes and modifications can be made without departing from the spirit and scope and without diminishing its intended The application is claimed as follows:

1. A memory element, comprising:
a layered structure including,
a memory layer that has a magnetization perpendicular to a film face and a magnetization direction that varies corresponding to information,
a magnetization-fixed layer that has a magnetization indirection perpendicular to the film face and becomes a reference for the information stored in the memory layer,
an insulating layer provided between the memory layer and the magnetization-fixed layer and formed of a non-magnetic material, and
a cap layer provided at a face side opposite to the insulating layer-side face of the memory layer, wherein:
an electron that is spin-polarized is injected in a lamination direction of the layered structure, and thereby the magnetization direction of the memory layer varies and a recording of information is performed with respect to the memory layer,
a magnitude of an effective diamagnetic field which the memory layer receives is smaller than a saturated magnetization amount of the memory layer, and
at least a face of the cap layer that comes into contact with the memory layer is formed of a Ta film.

2. The memory element according to claim 1, wherein the memory layer includes Co—Fe—B.

3. The memory element according to claim 2, wherein the cap layer comprises a non-magnetic film laminated on the Ta film that comes into contact with the memory layer.

4. The memory element according to claim 3, wherein the Ta film that comes into contact with the memory layer has a film thickness of 5 nm or less.

5. A memory device, comprising:
a memory element that retains information through a magnetization state of a magnetic material; and
two kinds of interconnects that intersect with each other,
wherein the memory element includes a layered structure including,
a memory layer that has a magnetization perpendicular to a film face and a magnetization direction that varies corresponding to information,
a magnetization-fixed layer that has a magnetization direction perpendicular to the film face and becomes a reference for the information stored in the memory layer,
an insulating layer provided between the memory layer and the magnetization-fixed layer and formed of a non-magnetic material, and
a cap layer provided at a face side opposite to the insulating layer-side face of the memory layer, wherein:
an electron that is spin-polarized is injected in a lamination direction of the layered structure, and thereby the magnetization direction of the memory layer varies and a recording of information is performed with respect to the memory layer,
a magnitude of an effective diamagnetic field which the memory layer receives is smaller than a saturated magnetization amount of the memory layer,
at least a face of the cap layer that comes into contact with the memory layer is formed of a Ta,
the memory element is disposed between the two kinds of interconnects, and
a current flows to the memory element in the lamination direction through the two kinds of interconnects, and thereby a spin-polarized electron is injected into the memory element.

6. The memory element according to claim 2, wherein a composition of Co—Fe—B in the memory layer is $(Co_x Fe_y)_{100-z} B_z$ where $0 \leq x \leq 40$, $60 \leq y \leq 100$, and $0 < z \leq 30$.